(12) United States Patent
de la Puente et al.

(10) Patent No.: US 7,928,755 B2
(45) Date of Patent: Apr. 19, 2011

(54) METHODS AND APPARATUS THAT SELECTIVELY USE OR BYPASS A REMOTE PIN ELECTRONICS BLOCK TO TEST AT LEAST ONE DEVICE UNDER TEST

(75) Inventors: Edmundo de la Puente, Cupertino, CA (US); David D. Eskeldson, Colorado Springs, CO (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 12/276,290

(22) Filed: Nov. 21, 2008

(65) Prior Publication Data

US 2009/0212799 A1  Aug. 27, 2009

Related U.S. Application Data

(63) Continuation-in-part of application No. 12/035,378, filed on Feb. 21, 2008.

(51) Int. Cl.
*G01R 31/26* (2006.01)
(52) U.S. Cl. ...................................................... 324/765
(58) Field of Classification Search .................. None
See application file for complete search history.

(56) References Cited

U.S. PATENT DOCUMENTS

| | | | |
|---|---|---|---|
| 5,471,481 A | 11/1995 | Okumoto et al. | |
| 6,065,144 A | 5/2000 | Knoch | |
| 6,275,023 B1 * | 8/2001 | Oosaki et al. | 324/158.1 |
| 6,275,962 B1 | 8/2001 | Fuller et al. | |
| 6,349,397 B1 | 2/2002 | Koga et al. | |
| 6,392,427 B1 | 5/2002 | Yang | |
| 6,483,338 B2 | 11/2002 | Weng et al. | |
| 6,499,121 B1 | 12/2002 | Roy et al. | |
| 7,091,598 B2 | 8/2006 | Fujita et al. | |
| 7,395,476 B2 | 7/2008 | Cowell et al. | |
| 7,421,632 B2 | 9/2008 | Jordan et al. | |
| 2006/0170453 A1 | 8/2006 | Zerbe et al. | |
| 2007/0216432 A1 | 9/2007 | Kister | |
| 2007/0266288 A1 | 11/2007 | Volkerink et al. | |
| 2008/0031166 A1 | 2/2008 | Fukada | |

OTHER PUBLICATIONS

International Search Report and Written Opinion for International Application No. PCT/US2008/034895 mailed on Apr. 16, 2009.
U.S. Appl. No. 12/035,378 of Edmundo de la Puente, et al. titled "Parallel Test Circuit with Active Devices", filed Feb. 21, 2008.

\* cited by examiner

*Primary Examiner* — Roberto Velez
(74) *Attorney, Agent, or Firm* — Holland & Hart, LLP (57) ABSTRACT

In one embodiment, apparatus for testing at least one device under test (DUT) includes a tester input/output (I/O) node, a DUT I/O node, a remote pin electronics block, a bypass circuit, and a control system. The remote pin electronics block provides a test function and is coupled between the tester I/O node and the DUT I/O node. The bypass circuit is coupled between the tester I/O node and the DUT I/O node and provides a signal bypass path between the tester I/O node and the DUT I/O node. The signal bypass path bypasses the test function provided by the remote pin electronics block. The control system is configured to enable and disable the bypass circuit. Methods for using this and other related apparatus to test one or more DUTs are also disclosed.

10 Claims, 7 Drawing Sheets

METHODS AND APPARATUS THAT SELECTIVELY USE OR BYPASS A REMOTE PIN ELECTRONICS BLOCK TO TEST AT LEAST ONE DEVICE UNDER TEST

CROSS-REFERENCE TO RELATED APPLICATION

This application is a continuation-in-part of the U.S. patent application of De La Puente et al. entitled "Parallel Test Circuit with Active Devices" (application Ser. No. 12/035, 378, filed Feb. 21, 2008), which application is hereby incorporated by reference for all that it discloses. The U.S. application Ser. No. 12/035,378 is referred to herein as the '378 application.

BACKGROUND

When testing devices, and particularly electrical devices, it is desirable to place the pin electronics that receive, drive, generate, process or evaluate test signals (i.e., provide test functions) as close as possible to a device under test (DUT). This is because, despite the many techniques for mitigating signal degradation over a signal transmission path, it is usually easier to mitigate signal degradation over a shorter signal path rather than a longer signal path.

Ideally, all of the pin electronics that need to interface with a DUT I/O would be placed very close to the DUT I/O. However, many DUTs have small form factors or high input/output (I/O) densities that make this difficult (or impossible). As a result, the designers of test systems often need to choose between 1) implementing a full spectrum of desired test functions at a location farther from the DUT I/O, or 2) implementing a reduced set of test functions at a location closer to the DUT I/O.

BRIEF DESCRIPTION OF THE DRAWINGS

Illustrative embodiments of the invention are illustrated in the drawings, in which.

DETAILED DESCRIPTION

Figure 1:
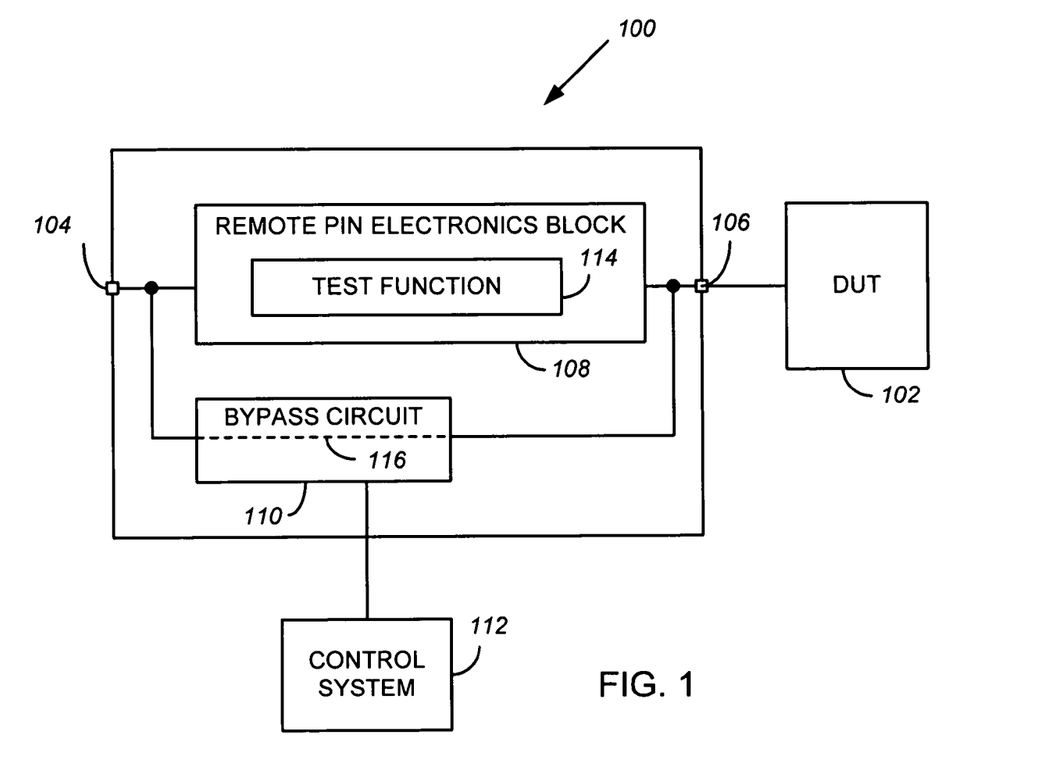
FIG. 1 illustrates first exemplary apparatus for testing at least one DUT.

FIG. 1 illustrates first exemplary apparatus 100 for testing at least one device under test (DUT) 102. The apparatus 100 comprises a tester I/O node 104, a DUT I/O node 106, a remote pin electronics block 108, a bypass circuit 110, and a control system 112. The remote pin electronics block 108 provides a test function 114 and is coupled between the tester I/O node 104 and the DUT I/O node 106. By way of example, the test function 114 may be a signal receiving, signal driving, signal generating, signal processing or signal evaluating function. The test function 114 may also be a collection of sub-functions, such as a collection of receive, evaluate and drive functions.

The bypass circuit 110 is coupled between the tester I/O node 104 and the DUT I/O node 106 and provides a signal bypass path 116 between the tester I/O node 104 and the DUT I/O node 106. The signal bypass path 116 provides a way to bypass the test function 114 provided by the remote pin electronics block 108. The control system 112 is configured to enable and disable the bypass circuit 110, thereby enabling and disabling the signal bypass path 116.

In some embodiments of the apparatus 100 shown in FIG. 1, test signals (e.g., DUT response signals) may be received from a DUT 102 via the DUT I/O node 106. When the bypass circuit 110 is disabled, the test signals are received, processed or evaluated by the test function 114 of the remote pin electronics block 108. An output of the test function 114 may then be provided to the tester I/O node 104. When the bypass circuit 110 is enabled, the test function 114 is bypassed, and the test signals propagate toward the tester I/O node 104 over the signal bypass path 116.

In other embodiments of the apparatus 100 shown in FIG. 1, test signals may be received from a test system via the tester I/O node 104. When the bypass circuit 110 is disabled, the test signals are received or processed by the test function 114 of the remote pin electronics block 108, and an output of the test function 114 may be provided (driven) to the DUT I/O node 106. When the bypass circuit 110 is enabled, the test function 114 is bypassed, and the test signals propagate toward the DUT I/O node 106 over the signal bypass path 116.

In still other embodiments of the apparatus shown in FIG. 1, the remote pin electronics block 108 and bypass circuit 110 may provide bidirectional signal paths between the tester I/O node 104 and DUT I/O node 106. In some cases, the control system 112 may provide a signal or signals that determine or enable a particular direction of signal flow through the remote pin electronics block 108 or bypass circuit 110.

Figure 2:
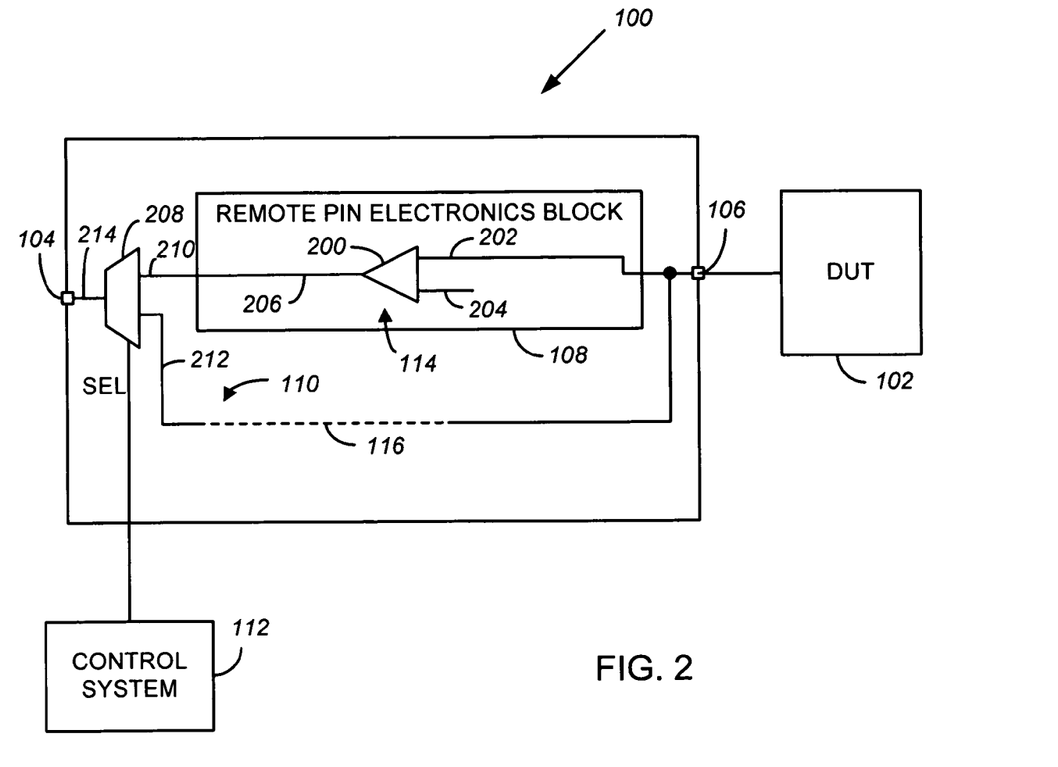
FIG. 2 illustrates a first exemplary implementation of the remote pin electronics block shown in FIG. 1, and an exemplary cooperation between the remote pin electronics block and bypass circuit.

FIG. 2 illustrates a first exemplary implementation of the remote pin electronics block 108 (which block is shown more generically in FIG. 1). In FIG. 2, the remote pin electronics block 108 is configured to receive test signals from the DUT 102 via the DUT I/O node 106. More particularly, the embodiment of the remote pin electronics block 108 shown in FIG. 2 comprises a comparator 200. The comparator 200 has a first input 202 that receives a signal from the DUT I/O node 106 and a second input 204 that receives a baseline signal. An output 206 of the comparator 200 is coupled to the tester I/O node 104.

FIG. 2 also illustrates an exemplary cooperation between the remote pin electronics block 108 and bypass circuit 110. In particular, the bypass circuit 110 is shown to comprise a multiplexer 208 having a first input 210 that receives an output of the remote pin electronics block 108 and a second input 212 coupled to the signal bypass path 116. An output 214 of the multiplexer 208 is coupled to the tester I/O node 104. The select input (SEL) of the multiplexer 208 is coupled to the control system 112. In this manner, the bypass circuit 110 is enabled by coupling the signal bypass path 116 to the tester I/O node 104, and the bypass circuit 110 is disabled by coupling the remote pin electronics block 108 to the tester I/O node 104.

Figure 3:
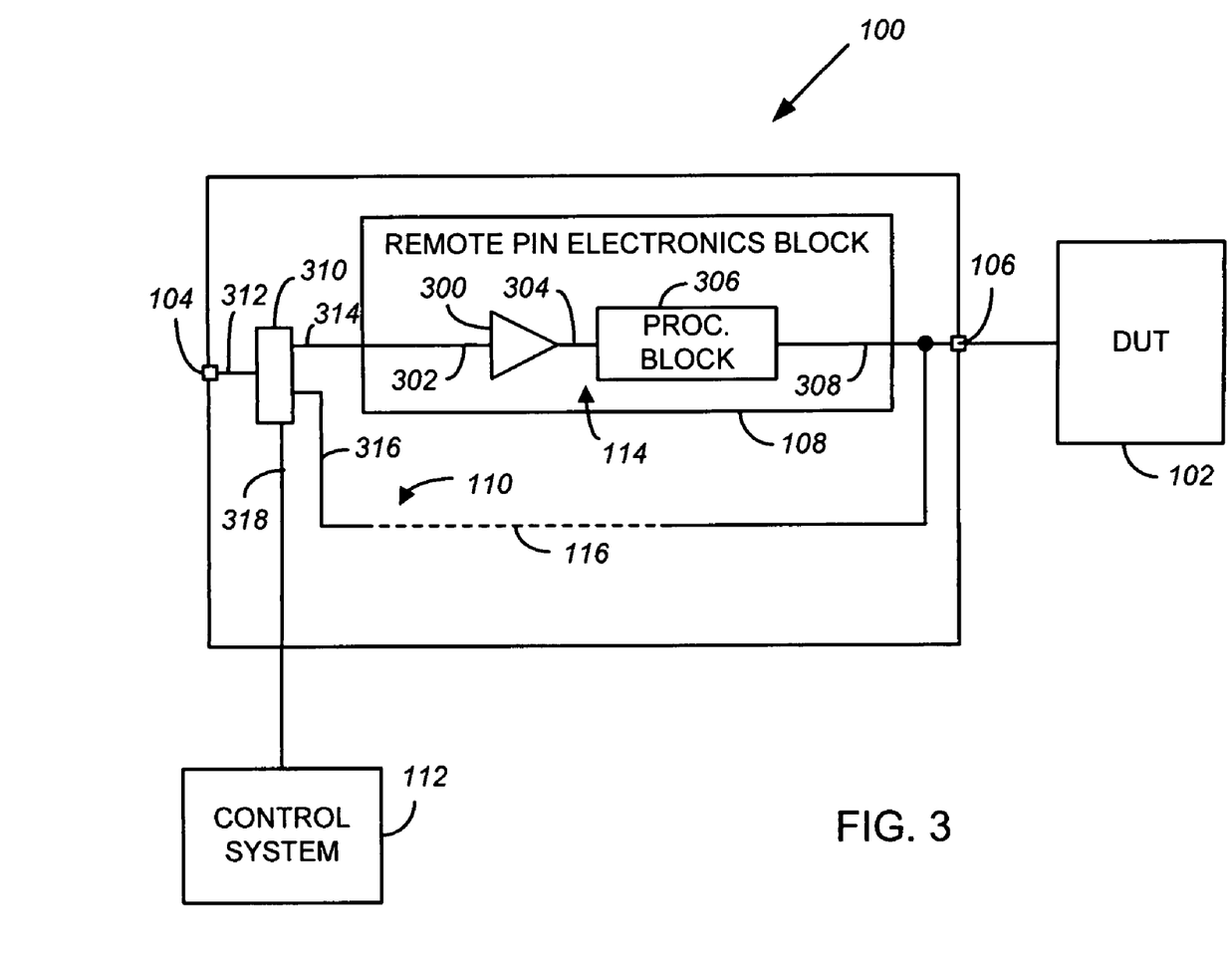
FIG. 3 illustrates a second exemplary implementation of the remote pin electronics block shown in FIG. 1, and an exemplary cooperation between the remote pin electronics and bypass circuit.

FIG. 3 illustrates a second exemplary implementation of the remote pin electronics block 108 (which block is shown more generically in FIG. 1). In FIG. 3, the remote pin electronics block 108 is configured to receive test signals from a test system via the tester I/O node 104. More particularly, the embodiment of the remote pin electronics block 108 shown in FIG. 3 comprises a driver 300. The driver 300 has an input 302 that receives a signal from the tester I/O node 104 and an output 304 that is coupled to a processing block 306. An output 308 of the processing block 306 is coupled to the DUT I/O node 106. By way of example, the processing block 306 could amplify a test signal, generate a test pattern in response to a test signal, or manipulate the timing of a test signal.

FIG. 3 also illustrates an exemplary cooperation between the remote pin electronics block 108 and bypass circuit 110. In particular, the bypass circuit 110 is shown to comprise a switching element 310 having an input 312 coupled to the tester I/O node 104, a first output 314 coupled to the driver input 302, and a second output 316 coupled to the signal bypass path 116. A control input 318 of the switching element 310 is coupled to the control system 112. In this manner, the bypass circuit 110 is enabled by coupling the signal bypass path 116 to the tester I/O node 104, and the bypass circuit 110 is disabled by coupling the driver 300 to the tester I/O node 104. In some embodiments, a second switching element could be used to couple one or the other of the remote pin electronics block 108 or bypass circuit 110 to the DUT I/O node 106.

Figure 4:
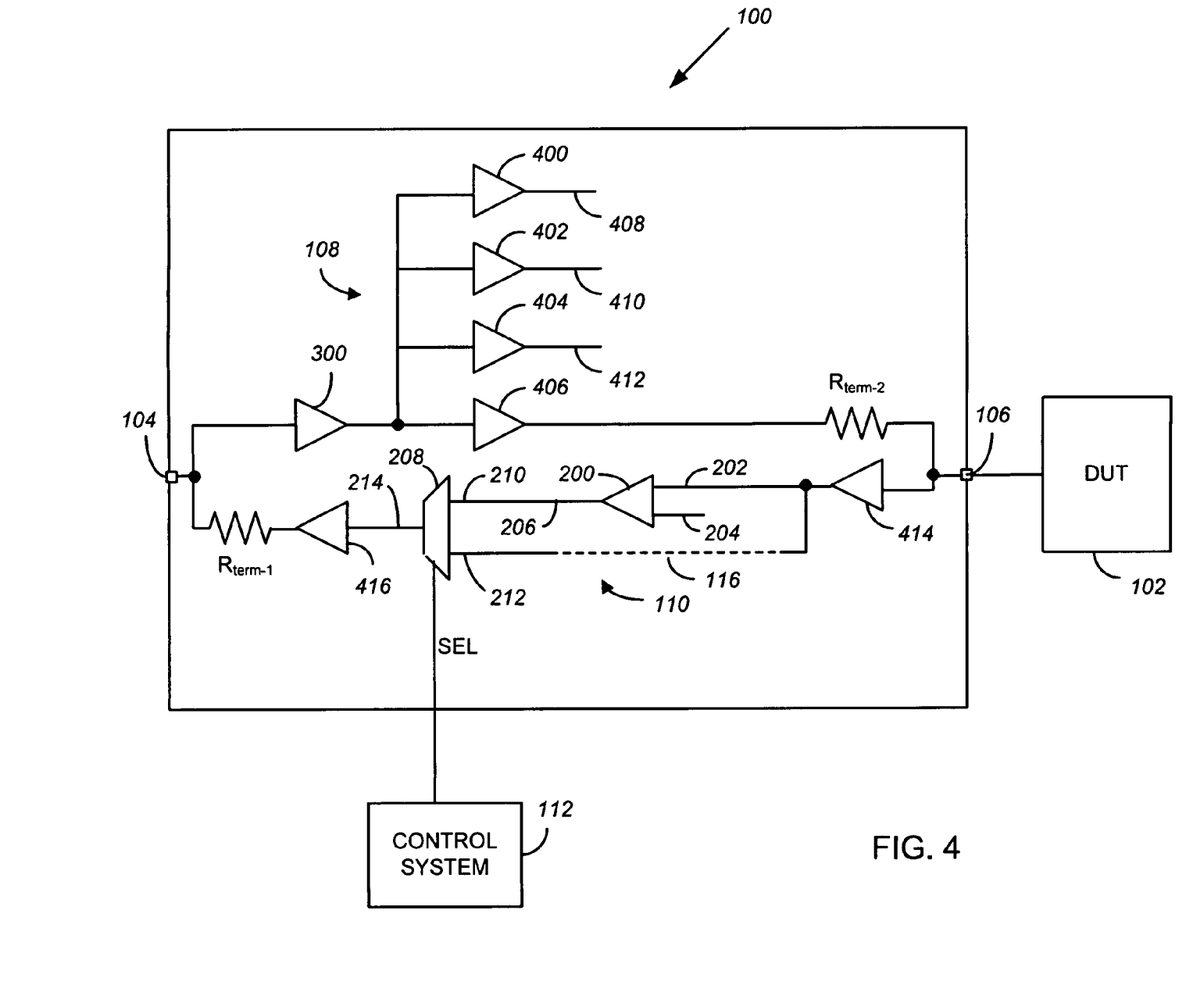
FIG. 4 illustrates an exemplary way in which the remote pin electronics block and bypass circuit of the FIG. 1 apparatus may provide bidirectional signal paths between a tester I/O node and DUT I/O node.

FIG. 4 illustrates a third exemplary implementation of the remote pin electronics block 108 (which block is shown more generically in FIG. 1). In FIG. 4, the remote pin electronics block 108 and bypass circuit 110 provide bidirectional signal paths between the tester I/O node 104 and DUT I/O node 106. By way of example, the remote pin electronics block 108 is shown to comprise a fan-out function, wherein a test signal received at the tester I/O node 104 is buffered by driver 300 and fanned-out by a plurality of additional drivers 400, 402, 404, 406 to multiple DUT I/O nodes 106, 408, 410, 412. The fan-out function can be bypassed by using the control system 112 to disable all but one of the fan-out drivers (e.g., all but driver 406, which is coupled to the DUT I/O node 106 via the termination resistor $R_{term-2}$). The remote pin electronics block 108 shown in FIG. 4 also comprises a compare function. The compare function receives test signals via the DUT I/O node 106 and receiver 414 and utilizes a comparator 200 to compare the received test signals to a baseline signal, as discussed with respect to FIG. 2, supra. The compare function may be bypassed by using the control system 112 to select the second input 212 of the multiplexer 208. The multiplexer 208 is coupled via a receiver 416 and termination resistor ($R_{term-1}$) to the tester I/O node 104.

Figure 5:
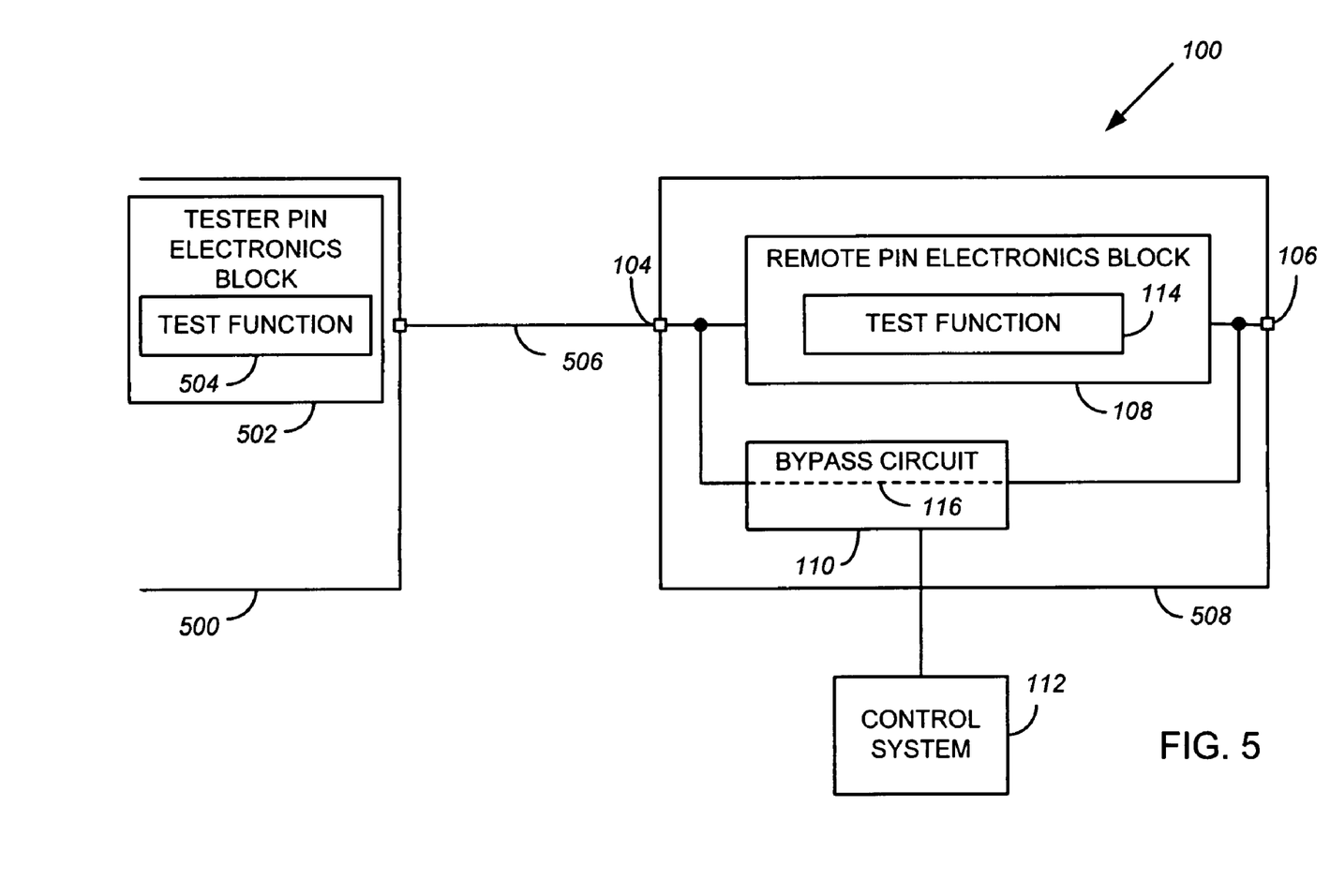
FIG. 5 illustrates an exemplary coupling of the apparatus shown in FIG. 1 to a test system.

FIG. 5 illustrates an exemplary coupling of the apparatus 100 shown in FIG. 1 to a test system 500. As shown, the test system 500 comprises a tester pin electronics block 502 that provides a test function 504. A signal path 506 couples the tester I/O node 104 to the tester pin electronics block 502 and the test function 504. In some embodiments, the remote pin electronics block 108 and bypass circuit 110 may be integrated in an integrated circuit 508.

Typically, but not necessarily, the signal path coupling the remote pin electronics block 108 to the DUT I/O node 106 will be shorter than the signal path 506, 116 coupling the tester pin electronics block 502 to the DUT I/O node 106.

The test functions 114, 304 provided by the remote pin electronics block 108 and the tester pin electronics block 502 may be the same or different. Typically, the test function 114 will be a test function that a user desires to execute more quickly, more often, or more accurately (e.g., a signal compare that needs to be executed before a DUT response signal experiences much, if any, degradation). The test function 504 may be, for example, a test function that requires more overhead or is implemented less frequently. To ensure that the highest quality signals are provided by and to the test system 500, the signal path 506 may be constructed as a transmission line.

Figure 6:
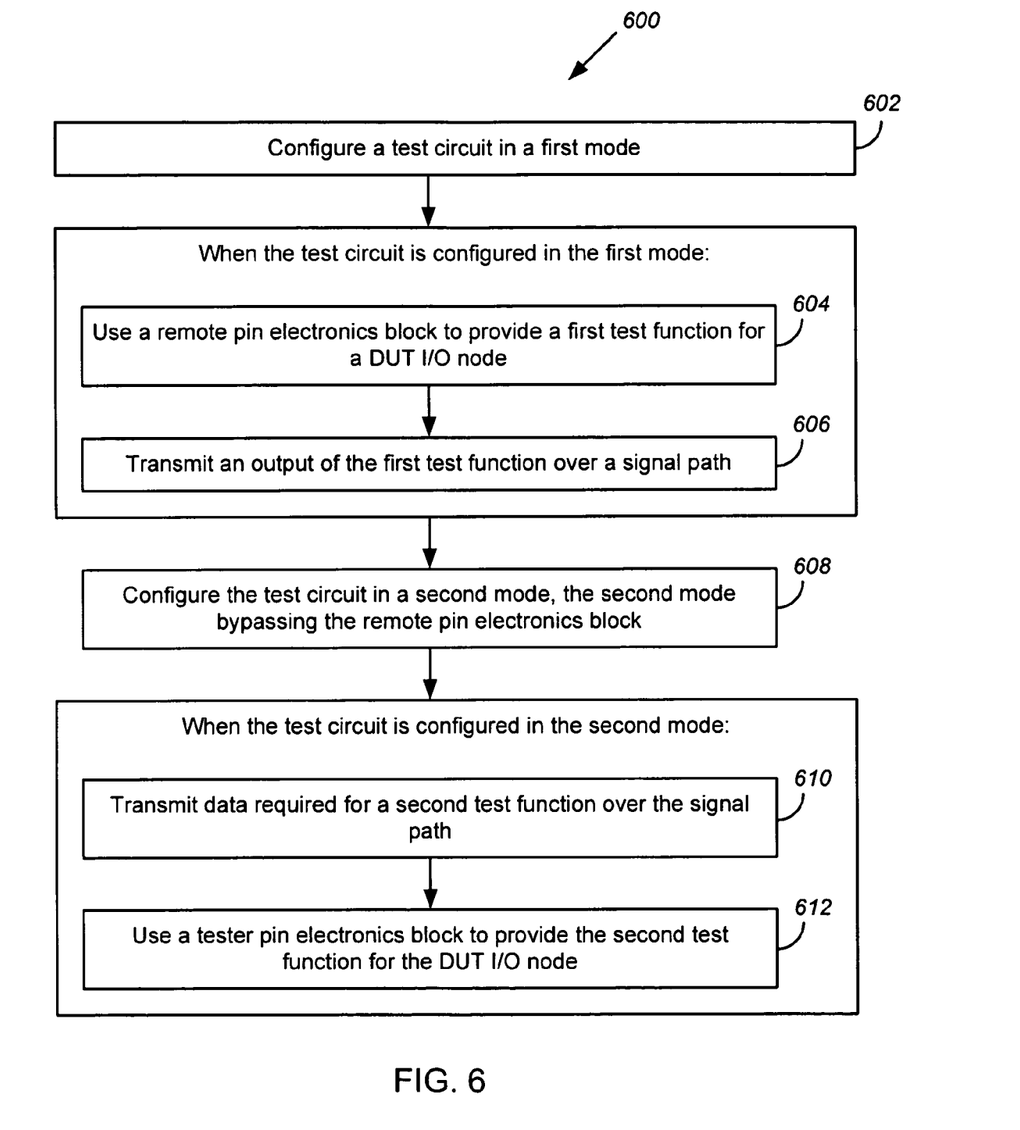
FIG. 6 illustrates an exemplary method for testing at least one DUT using, for example, the apparatus and test system shown in FIG. 5.

FIG. 6 illustrates an exemplary method 600 for testing at least one DUT using, for example, the apparatus 100 and test system 500 shown in FIG. 5. The method 600 comprises a step of configuring the apparatus 100 (e.g., a test circuit) in a first mode (at block 602). When the apparatus 100 is configured in the first mode, the remote pin electronics block 108 is used to provide a first test function 114 for the DUT I/O node 106 (at block 604), and a result of the first test function is transmitted to the test system 500 over the signal path 506 (at block 606).

Before or after the apparatus 100 is configured in the first mode, the method 600 may configure the apparatus 100 in a second mode (at block 608). In the second mode, the remote pin electronics 108 are bypassed. When the apparatus 100 is configured in the second mode, data required by the test function 504 is transmitted over the signal path 506 (at block 610), and the tester pin electronics block 502 is used to provide the test function 504 for the DUT I/O node 104 (at block 612).

When designing or executing a test program that utilizes the method 400, one may design or execute the test program such that a first plurality of tests is executed when the apparatus 100 is configured in the first mode, and then a second plurality of tests is executed when the apparatus 100 is configured in the second mode. Or, the test program may be designed such that the second plurality of tests is executed before the first.

Figure 7:
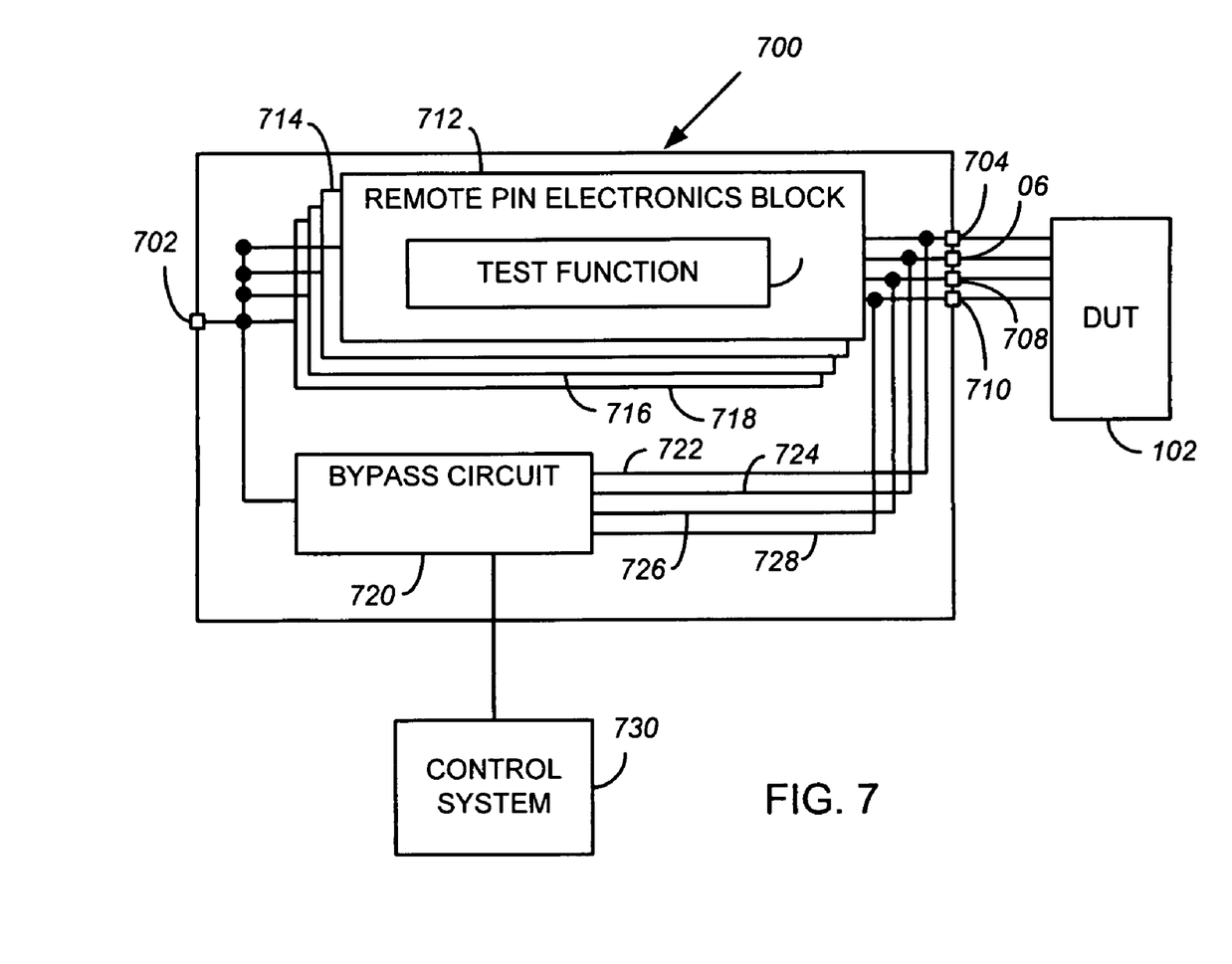
FIG. 7 illustrates how the apparatus shown in FIG. 1 can be expanded in an environment where test signals are fanned-in/fanned-out between a single tester I/O node and a plurality of DUT I/O nodes.

FIG. 7 illustrates how the apparatus 100 (FIG. 1) can be expanded in an environment where test signals are fanned-in/fanned-out between a single tester I/O node 702 and a plurality of DUT I/O nodes 704, 706, 708, 710. By way of example, the apparatus 700 provides a 1:4 fan-out. However, the principles employed by the apparatus 700 may be used to construct any circuit having a fan-out of 1:2 or greater.

The apparatus 700 comprises a remote pin electronics block 712, 714, 716, 718 per DUT I/O node 704, 706, 708, 710, each of which is coupled between a respective one of the DUT I/O nodes 704, 706, 708, 710 and a tester I/O node 702, and each of which provides a first test function for a respective DUT I/O node 704, 706, 708, 710. A bypass circuit 720 is coupled between the tester I/O node 702 and each of the plurality of DUT I/O nodes 704, 706, 708, 710. The bypass circuit 720 provides signal bypass paths 722, 724, 726, 728 between the tester I/O node 702 and each of the plurality of DUT I/O nodes 704, 706, 708, 710. A control system 730 is configured to enable one of the signal bypass paths 722, 724, 726, 728 at a time. In this manner, and in bypass mode, one of the DUT I/O nodes 704, 706, 708, 710 may be coupled to the tester I/O node 720 at a time.

In some embodiments, the tester I/O node 720 of the apparatus 700 may be coupled to a test system as shown in FIG. 5.

The '378 application discloses additional ways to implement the remote pin electronics blocks 712, 714, 716, 718 and bypass circuit 722.

In any of the apparatus 100, 700 disclosed herein, the bypass circuit 110 or 722 is preferably located in close proximity to the remote pin electronics blocks 108, 712, 714, 716, 718 that it bypasses, so as to minimize signal distortion between the alternate paths.

The DC attenuation or gain through a bypass circuit 110 or 720 is preferably consistent over temperature, such that it can be measured and calibrated out, or adjusted, across all temperatures.

What is claimed is:

1. Apparatus for testing at least one device under test (DUT), the apparatus comprising:
   a tester input/output (I/O) node;
   a plurality of DUT I/O nodes;
   a plurality of remote pin electronics blocks, each of the remote pin electronics blocks providing a first test function, and each of the remote pin electronics blocks being coupled between the tester I/O node and a respective one of the DUT I/O nodes;
   a bypass circuit coupled between the tester I/O node and each of the plurality of DUT I/O nodes, the bypass circuit providing signal bypass paths between the tester I/O node and respective ones of the plurality of DUT I/O nodes, and each of the signal bypass paths bypassing the first test function provided by a respective one of the remote pin electronics blocks; and
   a control system configured to enable and disable the bypass circuit and enable one of the signal bypass paths at a time.

2. The apparatus of claim 1, further comprising:
   a tester pin electronics block providing a second test function; and
   a signal path coupling the tester I/O node to the tester pin electronics block.

3. The apparatus of claim 2, further comprising an integrated circuit in which the remote pin electronics blocks and bypass circuit, but not the tester pin electronics block, are integrated.

4. The apparatus of claim 2, wherein the signal path comprises a transmission line.

5. The apparatus of claim 2, wherein signal paths coupling the remote pin electronics blocks to the respective ones of the DUT I/O nodes are shorter than signal paths coupling the tester pin electronics block to the DUT I/O nodes, wherein the signal paths coupling the tester pin electronics block to the DUT I/O nodes pass through the bypass circuit.

6. The apparatus of claim 2, wherein the first test function and the second test function are the same test function.

7. The apparatus of claim 2, wherein the first test function differs from the second test function.

8. The apparatus of claim 1, wherein each of the remote pin electronics blocks comprises a comparator, each comparator having a first input that receives a signal from a respective one of the DUT I/O nodes, a second input that receives a baseline signal, and an output that is coupled to the tester I/O node.

9. The apparatus of claim 1, wherein the bypass circuit provides bidirectional signal paths between the tester I/O node and the DUT I/O nodes.

10. The apparatus of claim 1, further comprising an integrated circuit in which the remote pin electronics blocks and bypass circuit are integrated.

* * * * *